US010950290B2

United States Patent
Lu et al.

(10) Patent No.: US 10,950,290 B2
(45) Date of Patent: Mar. 16, 2021

(54) MEMORY DEVICE AND OPERATING METHOD THEREOF THAT REDUCE OFF CURRENT TO REDUCE ERRORS IN READING AND WRITING DATA WHICH HAVE PLURALITY OF MEMORY CELL BLOCKS AND A SOURCE VOLTAGE GENERATOR

(71) Applicant: MACRONIX International Co., Ltd., Hsinchu (TW)

(72) Inventors: Chun-Chang Lu, Yunlin County (TW); Wen-Jer Tsai, Hualien County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/503,631

(22) Filed: Jul. 5, 2019

(65) Prior Publication Data
US 2021/0005241 A1  Jan. 7, 2021

(51) Int. Cl.
*G11C 11/4074* (2006.01)
*G06F 13/16* (2006.01)
*G11C 11/4094* (2006.01)
*G11C 11/4097* (2006.01)

(52) U.S. Cl.
CPC ...... *G11C 11/4074* (2013.01); *G06F 13/1668* (2013.01); *G11C 11/4094* (2013.01); *G11C 11/4097* (2013.01)

(58) Field of Classification Search
CPC ............ G11C 11/4074; G11C 11/4094; G11C 11/4097; G06F 13/1668

USPC ........................................ 365/189.09, 189.05
See application file for complete search history.

(56) References Cited

U.S. PATENT DOCUMENTS

| 5,581,503 | A | 12/1996 | Matsubara et al. | |
| 6,339,343 | B1 * | 1/2002 | Kim ...................... | G11C 7/1051 326/83 |
| 9,847,137 | B2 | 12/2017 | Hirose et al. | |
| 2004/0013021 | A1 * | 1/2004 | Takahashi ............ | G11C 7/1057 365/203 |
| 2008/0239810 | A1 * | 10/2008 | Lee ........................ | G11C 16/24 365/185.11 |
| 2011/0157251 | A1 * | 6/2011 | Lim .................. | H03K 19/01852 345/690 |

(Continued)

OTHER PUBLICATIONS

"Office Action of Taiwan Counterpart Application", dated May 6, 2020, p. 1-p. 6.

*Primary Examiner* — Connie C Yoha
(74) *Attorney, Agent, or Firm* — J.C. Patents

(57) ABSTRACT

A memory device is provided. The memory device includes a plurality of memory cell blocks and a source voltage generator. Each of the memory cell blocks has at least one memory cell. The source voltage generator is coupled to the plurality of memory cell blocks and configured to cause a source voltage of the memory cell block to be a first voltage according to that a memory cell in each of the memory cell blocks is in a selected state and cause a source voltage of the memory cell block to be a second voltage according to that all memory cells in each of the memory cell blocks are in an unselected state, wherein an absolute value of the first voltage is less than an absolute value of the second voltage. In addition, an operating method of the memory device is also provided.

7 Claims, 9 Drawing Sheets

(56) References Cited

U.S. PATENT DOCUMENTS

2014/0097481 A1* 4/2014 La Rosa ............ G11C 16/0433
                                                                  257/315

* cited by examiner

MEMORY DEVICE AND OPERATING METHOD THEREOF THAT REDUCE OFF CURRENT TO REDUCE ERRORS IN READING AND WRITING DATA WHICH HAVE PLURALITY OF MEMORY CELL BLOCKS AND A SOURCE VOLTAGE GENERATOR

BACKGROUND

Technical Field

The present disclosure relates to a memory device and an operating method thereof, and particularly to a memory device for reducing data read and write errors and an operating method thereof.

Description of Related Art

With the advancement of electronic technology, electronic products have become an important tool in our daily lives. Similarly, in order to provide more functions and to transmit more information, the capacity of memory device in electronic products is also increasing. As the demand for capacity increases, the size of the memory array also increases. However, when performing data reading and writing operations on the memory device, the sensing current is composed of on current (Ion) and off current (Ioff). Therefore, in the case where the memory array is large in size, the on current of the selected memory cell is likely to be interfered by the accumulated off current of the unselected memory cell, so that the subsequent circuit cannot recognize the correct logic, resulting in read and write error of the memory device. In addition, excessive off current can also cause a deterioration in the margin of threshold voltage.

SUMMARY

The disclosure provides a memory device and an operating method thereof, which can reduce off current to reduce errors in reading and writing data.

The memory device of the present disclosure includes: a plurality of memory cell blocks and a source voltage generator. Each of the memory cell blocks has at least one memory cell. The source voltage generator is coupled to the plurality of memory cell blocks and configured to cause a source voltage of the memory cell block to be a first voltage according to that a memory cell in each of the memory cell blocks is in a selected state and cause a source voltage of the memory cell block to be a second voltage according to that all memory cells in each of the memory cell blocks are in an unselected state, wherein an absolute value of the first voltage is less than an absolute value of the second voltage.

The operating method of a memory device of the present disclosure includes: providing a source voltage generator to cause a source voltage of the memory cell block to be a first voltage according to that a memory cell in each of the memory cell blocks is in a selected state and to cause a source voltage of the memory cell block to be a second voltage according to that all memory cells in each of the memory cell blocks are in an unselected state, wherein an absolute value of the first voltage is less than an absolute value of the second voltage.

Based on the above, an embodiment of the present disclosure provides a memory device and an operating method thereof. When a memory cell in the memory cell block is in a selected state, the source voltage generator outputs a first voltage to the source terminals of all memory cells in the memory cell block; when all memory cells in the memory cell block are in an unselected state, the source voltage generator outputs a second voltage of which the absolute value is greater than the first voltage to the source terminals of all memory cells in the memory cell block. In this way, the off current can be reduced to reduce errors in reading and writing data, and the situation in which the threshold voltage margin is deteriorated can be solved.

In order to make the aforementioned features and advantages of the disclosure more comprehensible, embodiments accompanying figures are described in detail below.

DESCRIPTION OF THE EMBODIMENTS

Figure 1:
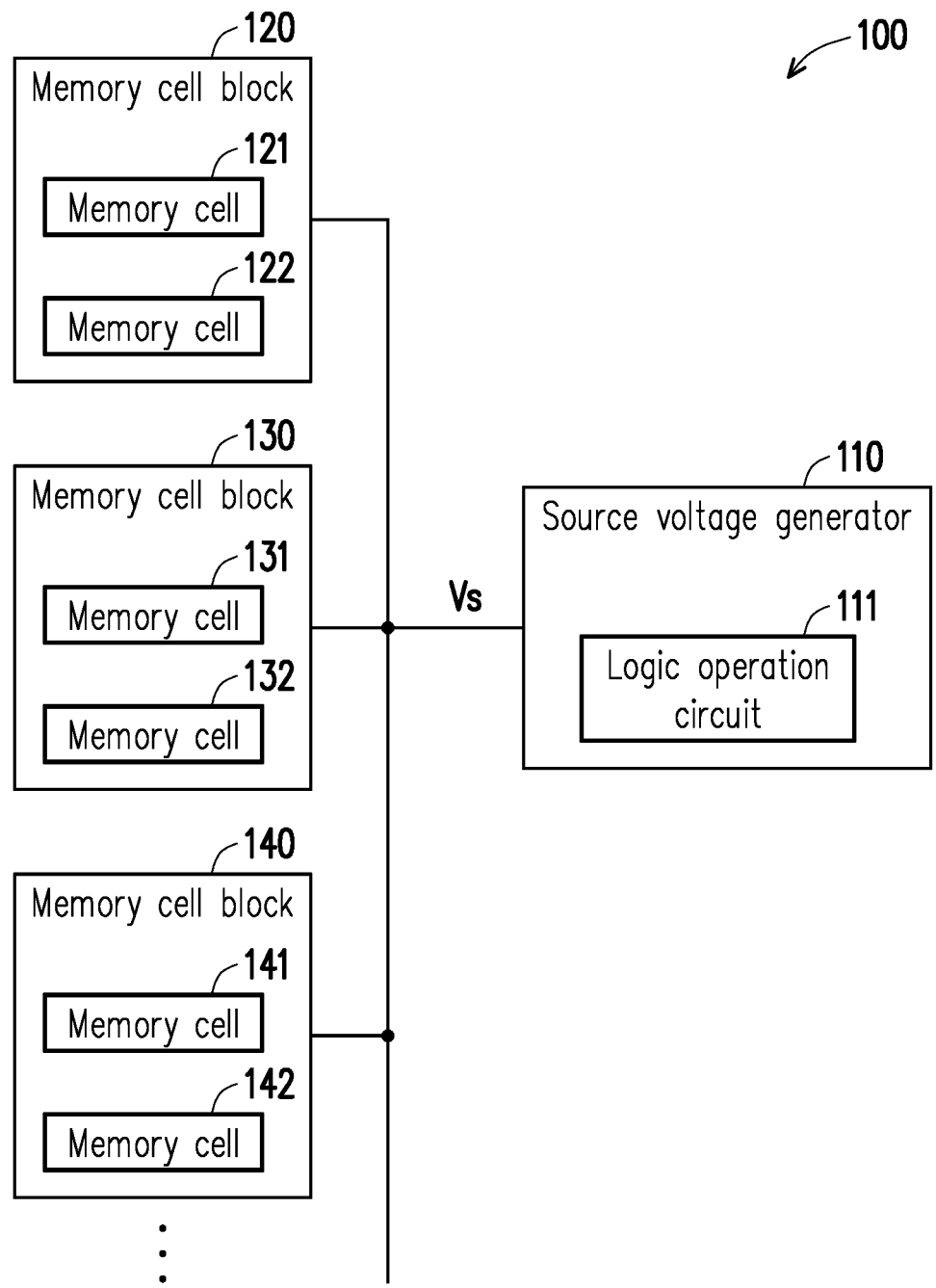
FIG. 1 is a schematic view of a memory device according to an embodiment of the disclosure.

FIG. 1 is a schematic view of a memory device according to an embodiment of the disclosure. Referring to FIG. 1, a memory device 100 includes a plurality of memory cell blocks and a source voltage generator 110. The source voltage generator 110 is coupled to a plurality of memory cell blocks, and each of the memory cell blocks has at least one memory cell. The memory device 100 is, for example, a non-volatile memory, and the disclosure is not limited thereto.

For ease of description, the memory device 100 of the present embodiment includes a memory cell block 120, a memory cell block 130, and a memory cell block 140. However, the present disclosure provides no limitation to the number of memory cell blocks. In addition, each of the memory cell blocks of the embodiment has two memory cells, the memory cell block 120 has a memory cell 121 and a memory cell 122, the memory cell block 130 has a memory cell 131 and a memory cell 132, and the memory cell block 140 has a memory cell 141 and a memory cell 142. However, the present disclosure provides no limitation to the number of memory cells in the memory cell block.

Figure 2:
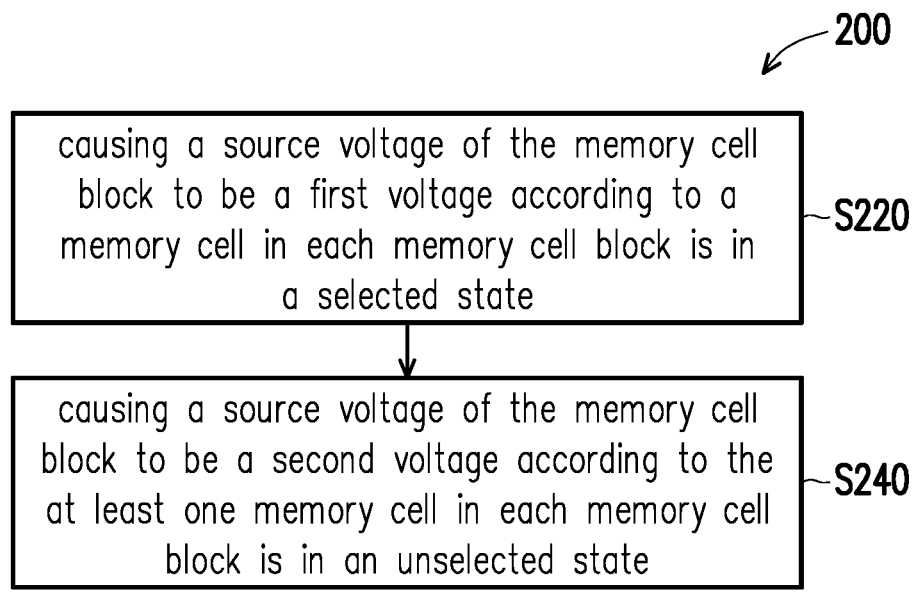
FIG. 2 is a detailed flowchart of an operating method of a memory device according to an embodiment of the disclosure.

FIG. 2 is a detailed flowchart of an operating method of a memory device according to an embodiment of the disclosure. The operating method 200 of the memory device of the embodiment of FIG. 2 is applicable to the memory device 100 of the embodiment of FIG. 1. The operating method 200 of the memory device of the embodiment of FIG. 2 will be described in detail below with reference to the elements of the embodiment of FIG. 1.

First, the source voltage generator 110 causes the source voltage of the memory cell block to be the first voltage according to that a memory cell in each of the memory cell blocks is in a selected state (step S220). That is, when a memory cell in the memory cell block is in the selected state, the source voltage generator 110 outputs the first voltage to the source terminals of all memory cells in the memory cell block. For example, referring to FIG. 1, if the memory cell 131 in the memory cell block 130 is in an unselected state, the memory cell 132 is in the selected state, then the source voltage generator 110 outputs a source voltage Vs as the first voltage to memory cell block 130. It should be noted that the unselected state and selected state of the memory cell will be further explained in FIG. 3.

Then, the source voltage generator 110 causes the source voltage of the memory cell block to be a second voltage according to that all memory cells in each of the memory cell blocks are in the unselected state (step S240). Specifically, the absolute value of the first voltage is less than the absolute value of the second voltage. That is, when all memory cells in the memory cell block are in the unselected state, the source voltage generator 110 outputs a second voltage of which the absolute value is greater than the first voltage to the source terminals of all memory cells in the memory cell block. For example, referring again to FIG. 1, if the memory cell 121 and the memory cell 122 in the memory cell block 120 are both in the unselected state, the source voltage generator 110 outputs the source voltage Vs as the second voltage to the memory cell block 120. Similarly, if the memory cell 141 and the memory cell 142 in the memory cell block 140 are both in the unselected state, the source voltage generator 110 also outputs the source voltage Vs as the second voltage to the memory cell block 140.

In this case, the step S220 and the step S240 can be performed simultaneously or switched, and the sequence of the steps is only an implementation of the embodiment, and the disclosure is not limited thereto.

Figure 3:
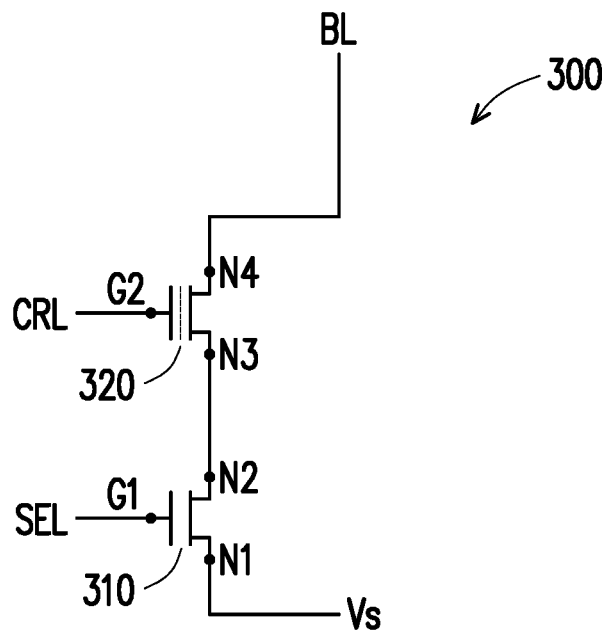
FIG. 3 is a schematic view of a memory cell according to an embodiment of the disclosure.

FIG. 3 is a schematic view of a memory cell according to an embodiment of the disclosure. Referring to FIG. 3, a memory cell 300 includes a selection transistor 310 and a floating gate transistor 320. The selection transistor 310 has a first terminal N1, a second terminal N2, and a gate terminal G1, and the floating gate transistor 320 has a third terminal N3, a fourth terminal N4 and a gate terminal G2. The third terminal N3 of the floating gate transistor 320 is coupled to the second terminal N2 of the selection transistor 310, and the fourth terminal N4 is coupled to the bit line BL.

In this embodiment, the first terminal N1 receives the source voltage Vs, the gate terminal G1 receives the selection signal SEL, and the gate terminal G2 receives the control signal CRL. When the gate terminal G1 receives the selection signal SEL as the voltage 0, the memory cell 300 is in the unselected state; in contrast, when the gate terminal G1 receives the selection signal SEL as the voltage Vcc, the memory cell 300 is in the selected state. It should be noted that only one memory cell in the memory device 100 can be in the selected state, and the remaining memory cells are all in the unselected state.

Figure 4:
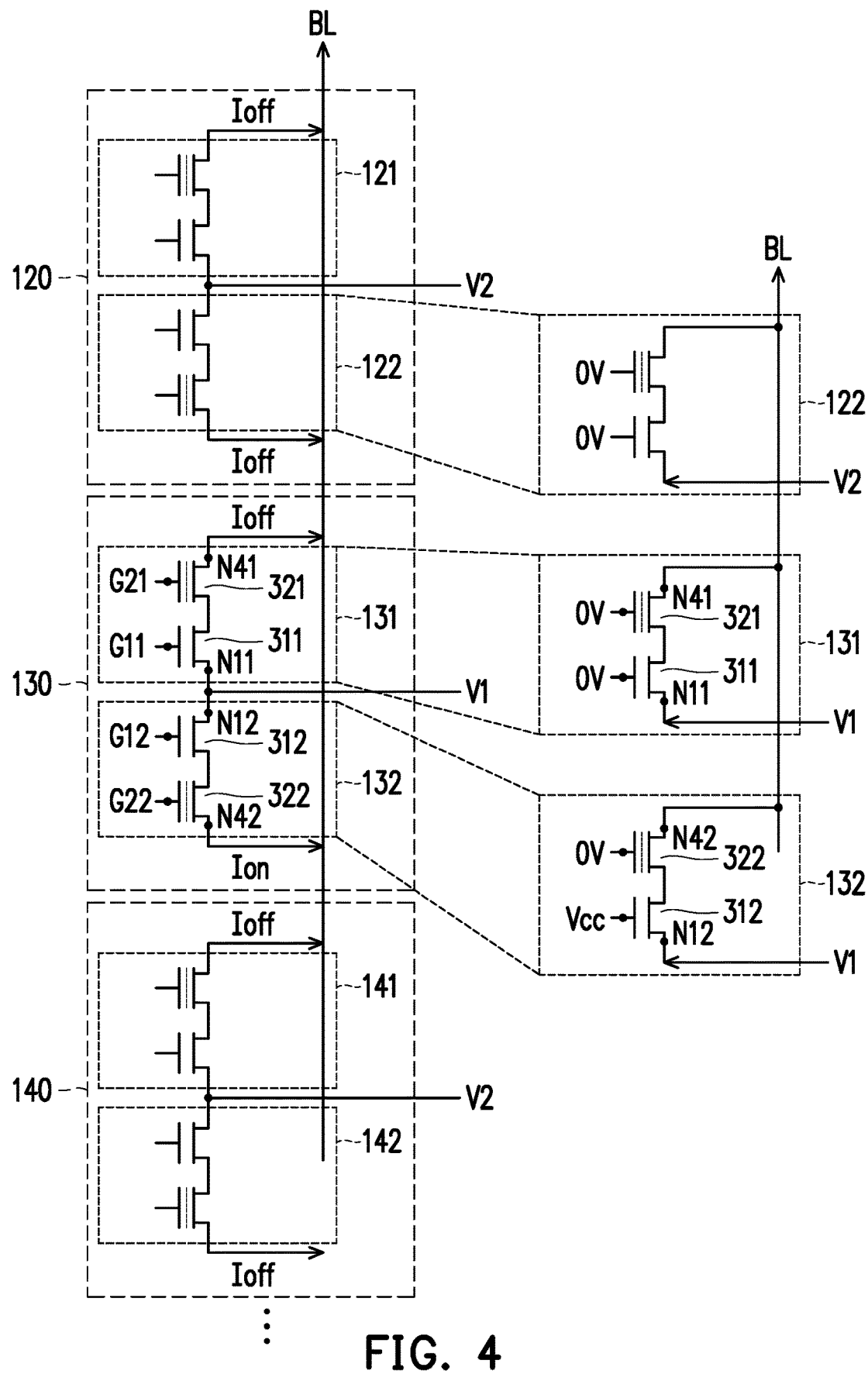
FIG. 4 is a schematic view of a plurality of memory cell blocks of a memory device according to an embodiment of the disclosure.

FIG. 4 is a schematic view of a plurality of memory cell blocks of a memory device according to an embodiment of the disclosure. Referring to FIG. 4, the plurality of memory cell blocks in FIG. 4 are similar to the plurality of memory cell blocks in FIG. 1. The only difference between the two is that each of the memory cell blocks of FIG. 4 has at least two memory cells. However, for the purpose of easy description like in FIG. 1, each of the memory cell blocks of the embodiment has two memory cells.

The following is a detailed description of the structure in which the memory cells in each of the memory cell blocks of the embodiment are connected to each other. Taking the memory cell block 130 as an example, the memory cell block 130 has the memory cell 131 and the memory cell 132. The first terminal N11 of the selection transistor 311 in the memory cell 131 is coupled to the first terminal N12 of the selection transistors 312 in the memory cell 132 to collectively receive the source voltage Vs. The fourth terminal N41 of the floating gate transistor 321 in the memory cell 131 and the fourth terminal N42 of the floating gate transistor 322 in the memory cell 132 are coupled to the bit line BL. The structure in which the memory cells in the memory cell block 120 and the memory cell block 140 are connected to each other is the same as the structure in which the memory cells in the memory cell block 130 are connected to each other, and no further description is incorporated herein.

In this embodiment, the memory cell 132 is in the selected state, and the remaining memory cells are all in the unselected state. Therefore, in the memory cell block 130, the gate terminal G11 of the selection transistor 311 in the memory cell 131 receives the selection signal as the voltage 0, and the gate terminal G12 of the selection transistor 312 in the memory cell 132 receives the selection signal as the voltage Vcc. The source voltage generator 110 outputs the source voltage Vs as the voltage V1 to the memory cell block 130. Moreover, in the memory cell block 120 and the memory cell block 140, the gate terminals of the selection transistors in the memory cell 121, the memory cell 122, the memory cell 141, and the memory cell 142 receive the selection signal as the voltage 0, and the source voltage generator 110 outputs the source voltage Vs as the voltage V2 to the memory cell block 120 and the memory cell block 140.

It should be noted that in the present embodiment, the gate terminal G21 of the floating gate transistor 321 in the memory cell 131 and the gate terminal G22 of the floating gate transistor 322 in the memory cell 132 receive the control signal as the voltage 0. Moreover, the gate terminals of the floating gate transistors in the memory cell 121, the memory cell 122, the memory cell 141, and the memory cell 142 also receive the control signal as the voltage 0. Further, in the present embodiment, the absolute value of the voltage V1 is less than the absolute value of the voltage V2.

In an implementation, the voltage V1 is 0 volt and the voltage V2 is greater than 0 volt, such that the Vgs of the unselected memory cells (memory cell 121, memory cell 122, memory cell 141, and memory cell 142) are less than 0 volt, and the unselected memory cells (memory cell 121, memory cell 122, memory cell 141, and memory cell 142) are forced to turn strongly off. Therefore, when the data reading and writing operation of the memory device is performed, the off current Ioff in the memory device can be reduced to improve the situation in which the on current Ion of the selected memory cell is interfered by the accumulated off current Ioff of the unselected memory cells, and also to improve the threshold voltage margin deterioration, thereby enhancing read and write accuracy of the memory device.

Referring again to FIG. 1, in an embodiment, when each of the memory cell blocks has at least two memory cells, the source voltage generator 110 includes a logic operation circuit 111, and the logic operation circuit 111 performs a logic operation on the memory cell block 120, the memory cell block 130 and the memory cell block 140 to generate a source voltage Vs.

Figure 5:
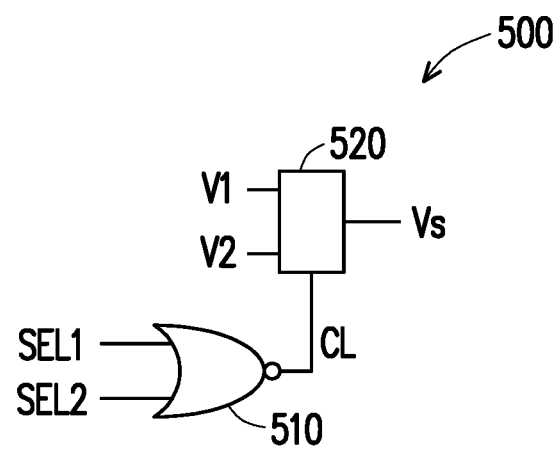
FIG. 5 is a schematic view of a logic operation circuit according to an embodiment of the disclosure.

FIG. 5 is a schematic view of a logic operation circuit according to an embodiment of the disclosure. Referring to FIG. 5, the logic operation circuit 500 includes a plurality of NOR gates and a plurality of multiplexers. However, in the present embodiment, only one NOR gate (NOR gate 510) and one multiplexer (multiplexer 520) are taken as an example. The NOR gate 510 is coupled to the memory cell block, and the multiplexer 520 is coupled to the NOR gate 510. The NOR gate 510 receives the selection signals (the selection signal SEL1 and the selection signal SEL2 are taken as an example) of all memory cells in each of the memory cell blocks, and outputs the control signal CL to the multiplexer 520. The multiplexer 520 selectively outputs the voltage V1 or the voltage V2 to the source terminals of all memory cells in the memory cell block according to the control signal CL.

In this embodiment, the logical operation can be an NOR logical operation. However, in another embodiment, the logical operation may also be a logical operation equivalent to the NOR logical operation, and the disclosure is not limited thereto. In addition, in this embodiment, the absolute value of the voltage V1 is less than the absolute value of the voltage V2. However, in other embodiments, when the logical operation is OR logical operation, the absolute value of the voltage V1 may be greater than the absolute value of the voltage V2. In addition, in this embodiment, the multiplexer 520 may be designed through a hardware description language (HDL) or any other digital circuit design method commonly known to those of ordinary skill in the art, and is a multiplexer commonly known to those of ordinary skill in the art.

Specifically, the logic operation circuit of FIG. 5 can be applied to the plurality of memory cell blocks of the memory device of FIG. 4 to perform logical operations on the plurality of memory cell blocks in FIG. 4 to generate the source voltage Vs.

Figure 6:
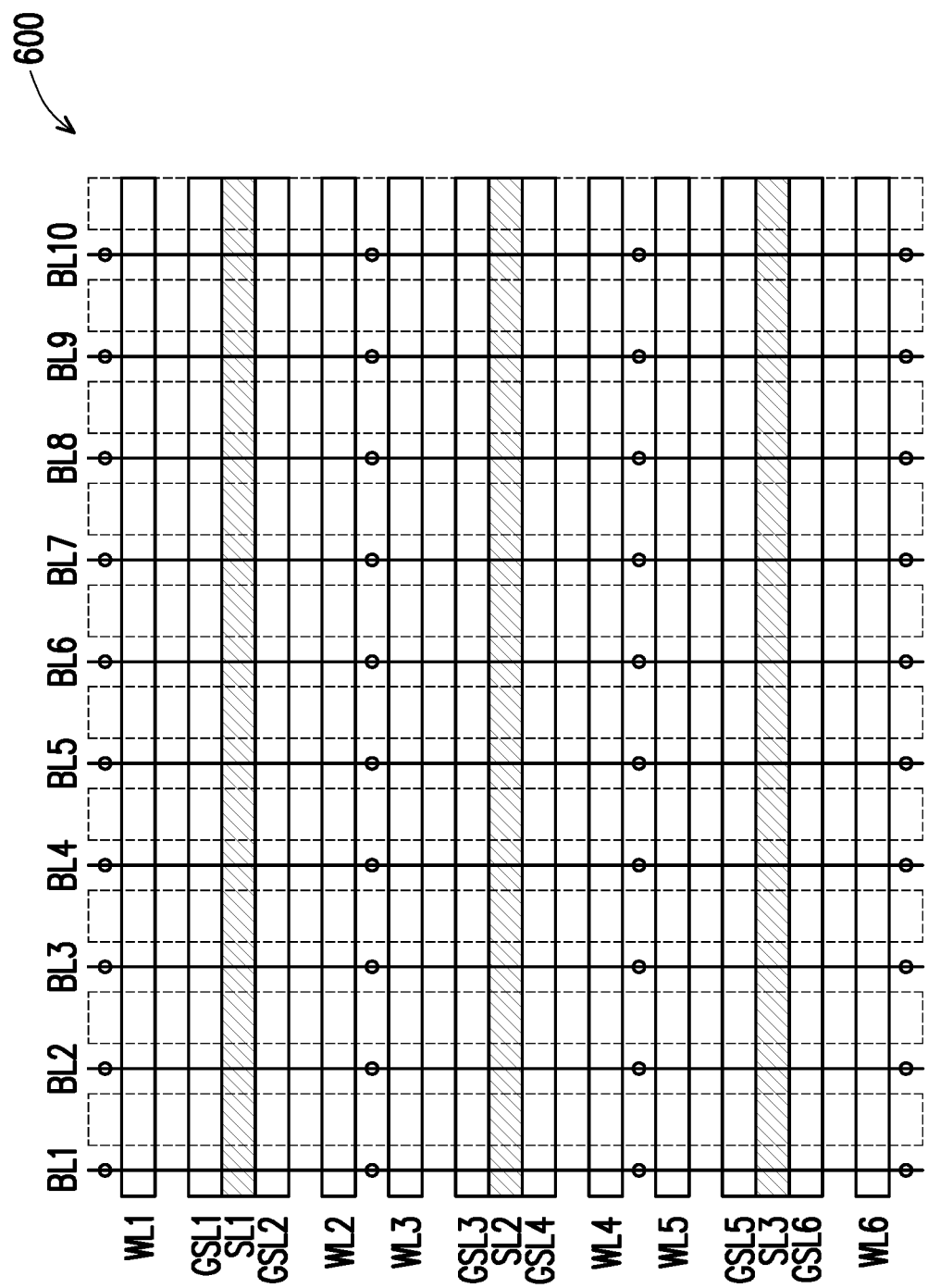
FIG. 6 and FIG. 7 are schematic views showing a memory device of a two-dimensional structure according to an embodiment of the disclosure.
Figure 7:
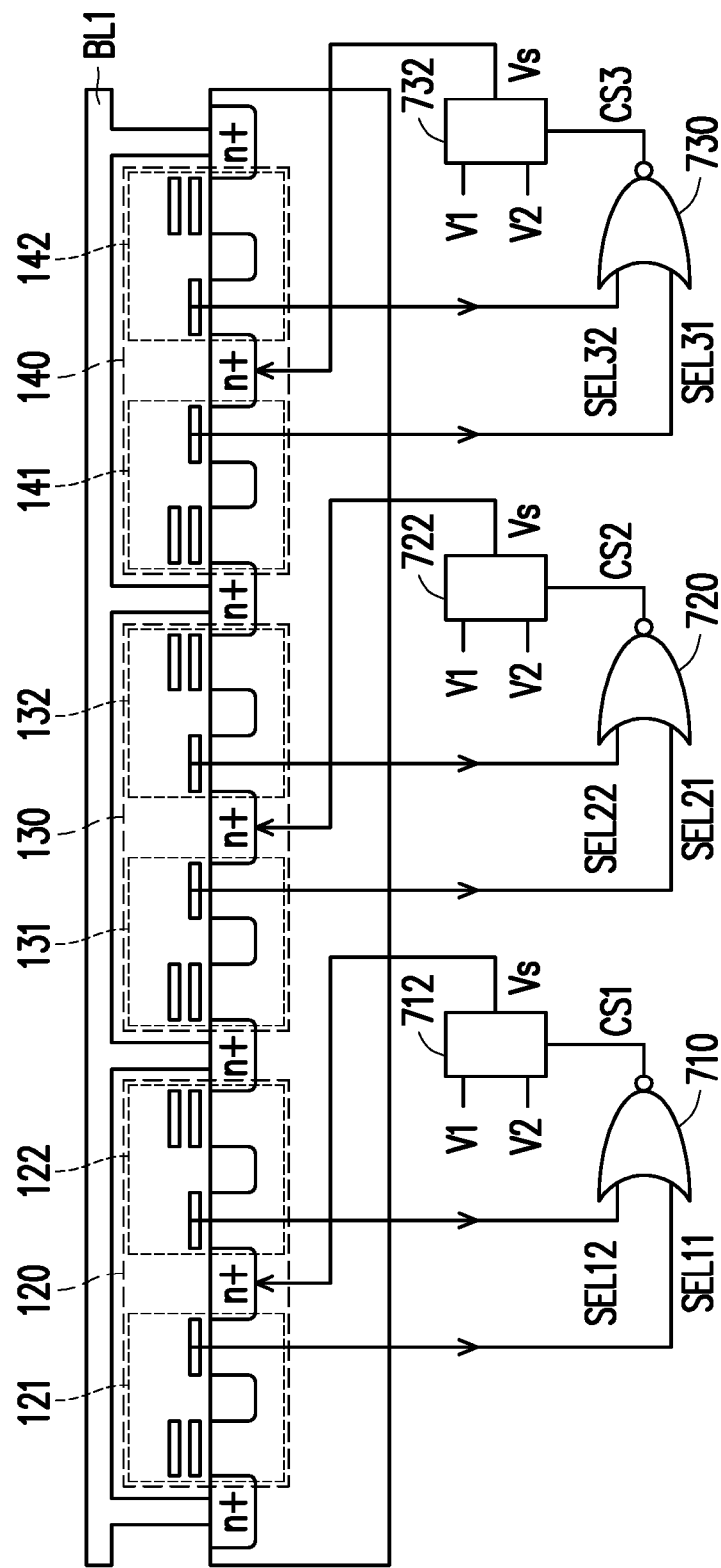
Figure 8:
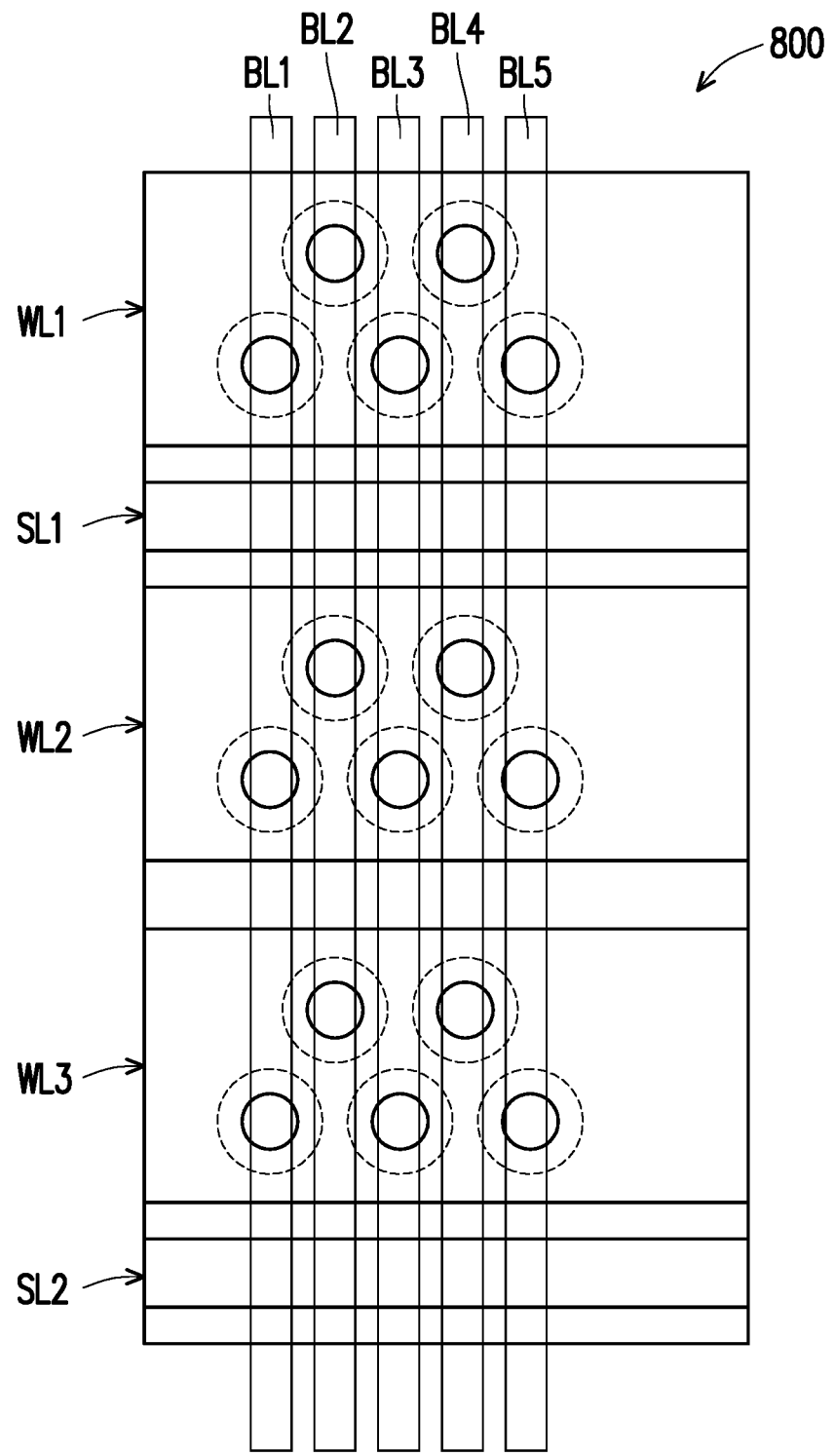
FIG. 8 and FIG. 9 are schematic views showing a memory device of a three-dimensional structure according to an embodiment of the disclosure.
Figure 9:
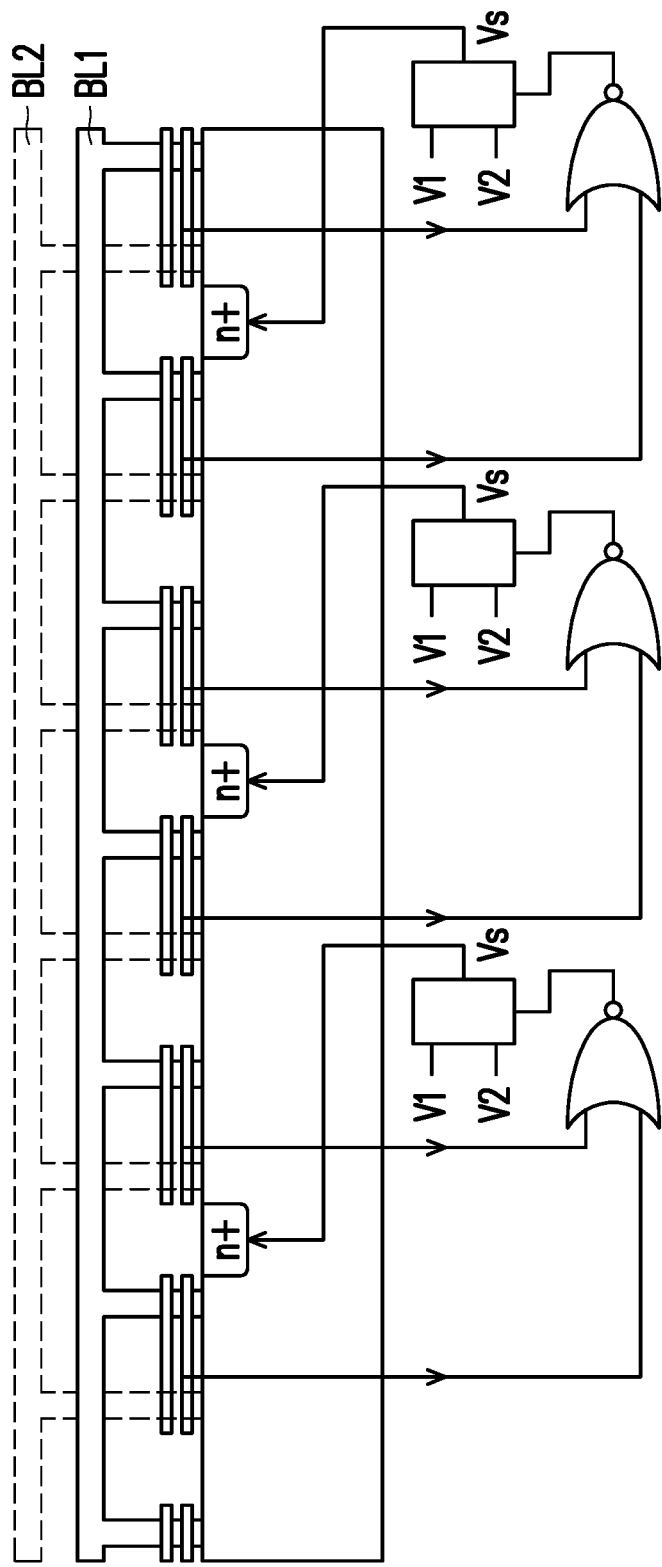

It should be noted that the memory device of the embodiment of the present disclosure may be a two-dimensional flash memory or a three-dimensional flash memory. Please refer to FIG. 6 to FIG. 9 respectively. FIG. 6 and FIG. 7 are schematic views showing a memory device of a two-dimensional structure according to an embodiment of the disclosure. FIG. 8 and FIG. 9 are schematic views showing a memory device of a three-dimensional structure according to an embodiment of the disclosure. It should be noted that FIG. 6 to FIG. 9 illustrate a memory device in which each of the memory cell blocks has two memory cells.

In FIG. 6, the memory device 600 is a two-dimensional flash memory. The memory device 600 has word lines WL1 to WL6, bit lines BL1 to BL10, selection signal lines GSL1 to GSL6, and source lines SL1 to SL3. The word line WL1, the selection signal line GSL1, the source line SL1, the selection signal line GSL2, and the word line WL2 are arranged sequentially in the longitudinal direction. The source voltage generator 110 is configured to generate the source voltage Vs to drive the plurality of source lines SL1 to SL3. In FIG. 6, the memory cell can be disposed at the position where the bit line BL1 and the word line WL1, the selection signal line GSL1 and the source line SL1 are interleaved; and another memory cell can be disposed at the position where the bit line BL1 and the source line SL1, the selection signal line GSL2 and the word line WL2 are interleaved. The two memory cells constitute a memory cell block in the memory device 600, and receive the source voltage Vs through the same source line SL1.

In this embodiment, the memory device 600 has a plurality of memory cell blocks, and the structures of the plurality of memory cell blocks are as described above, and no further description is made herein. In addition, in this embodiment, the number of the word lines, the bit lines, the selection signal lines, and the source lines in the memory device 600 of FIG. 6 should not be construed as a limitation to the number of the word lines, the bit lines, the selection signal lines, and source lines.

FIG. 7 is a schematic side view of the memory device 600, which may also be a schematic side view of the memory device 100. In FIG. 7, a plurality of N-type heavily doped regions (N+) are disposed as the sources and drains of the transistor in the memory cell 121, the transistor in the memory cell 122, the transistor in the memory cell 131, the transistor in the memory cell 132, the transistor in the memory cell 141 and the transistor in the memory cell 142. Moreover, the logic operation circuit 500 of FIG. 5 is utilized to perform a logical operation on the memory cell block 120, the memory cell block 130, and the memory cell block 140 to generate the source voltage Vs. Specifically, the NOR gate 710, the NOR gate 720, and the NOR gate 730 are coupled to the memory cell block 120, the memory cell block 130, and the memory cell block 140, respectively; the multiplexer 712, the multiplexer 722, and the multiplexer 732 are coupled to the NOR gate 710, the NOR gate 720, and the NOR gate 730, respectively. The NOR gate 710 receives the selection signal SEL11 of the memory cell 121 and the selection signal SEL12 of the memory cell 122 and outputs the control signal CS1. Then, the multiplexer 712 selectively outputs the voltage V1 or the voltage V2 to the source terminal of the memory cell 121 and the memory cell 122 in the memory cell block 120 according to the control signal CS1. Similarly, the NOR gate 720 receives the selection signal SEL21 of the memory cell 131 and the selection signal SEL22 of the memory cell 132 and outputs the control signal CS2. Then, the multiplexer 722 selectively outputs the voltage V1 or the voltage V2 to the source terminal of the memory cell 131 and the memory cell 132 in the memory cell block 130 according to the control signal CS2. The NOR gate 730 receives the selection signal SEL31 of the memory cell 141 and the selection signal SEL32 of the memory cell 142 and outputs the control signal CS3. Then, the multiplexer 732 selectively outputs the voltage V1 or the voltage V2 to the source terminal of the memory cell 141 and the memory cell 142 in the memory cell block 140 according to the control signal CS3.

In FIG. 8, the memory device 800 is a three-dimensional flash memory. The memory device 800 has word lines WL1 to WL3, bit lines BL1 to BL5, a plurality of selection signal lines GSL (not shown), and source lines SL1 and SL2. The source voltage generator 110 is configured to generate the source voltage Vs to drive the source lines SL1 and SL2. Similar to FIG. 6, in FIG. 8, the memory cells can be disposed at the position where the bit lines and the word lines, the selection signal lines and the source lines are interleaved.

In this embodiment, based on the three-dimensional structure, the word lines WL1 to WL3 can be configured according to different height levels, respectively. Each of the word lines WL1, WL2, WL3 is extended in a horizontal direction. The bit lines BL1 to BL5 can be arranged in a manner of being orthogonal to the word lines WL1 to WL3. In addition, in this embodiment, the number of the word lines, the bit lines, the selection signal lines, and the source lines in the memory device 800 of FIG. 8 should not be construed as a limitation to the number of the word lines, the bit lines, the selection signal lines, and the source lines.

FIG. 9 is a schematic side view of the memory device 800. In FIG. 9, the bit line BL1 is located on the front side of the bit line BL2, and further, a plurality of N-type heavily doped regions (N+) are disposed as the source of the transistor in the memory cell. The drain of the transistor is coupled to a bit line through a vertical channel. Meanwhile, the logic operation circuit 500 of FIG. 5 is utilized to perform a logical operation on the plurality of memory cell blocks to generate the source voltage Vs. Since the logical operation is similar to FIG. 7, no further descriptions are incorporated herein.

Figure 10:
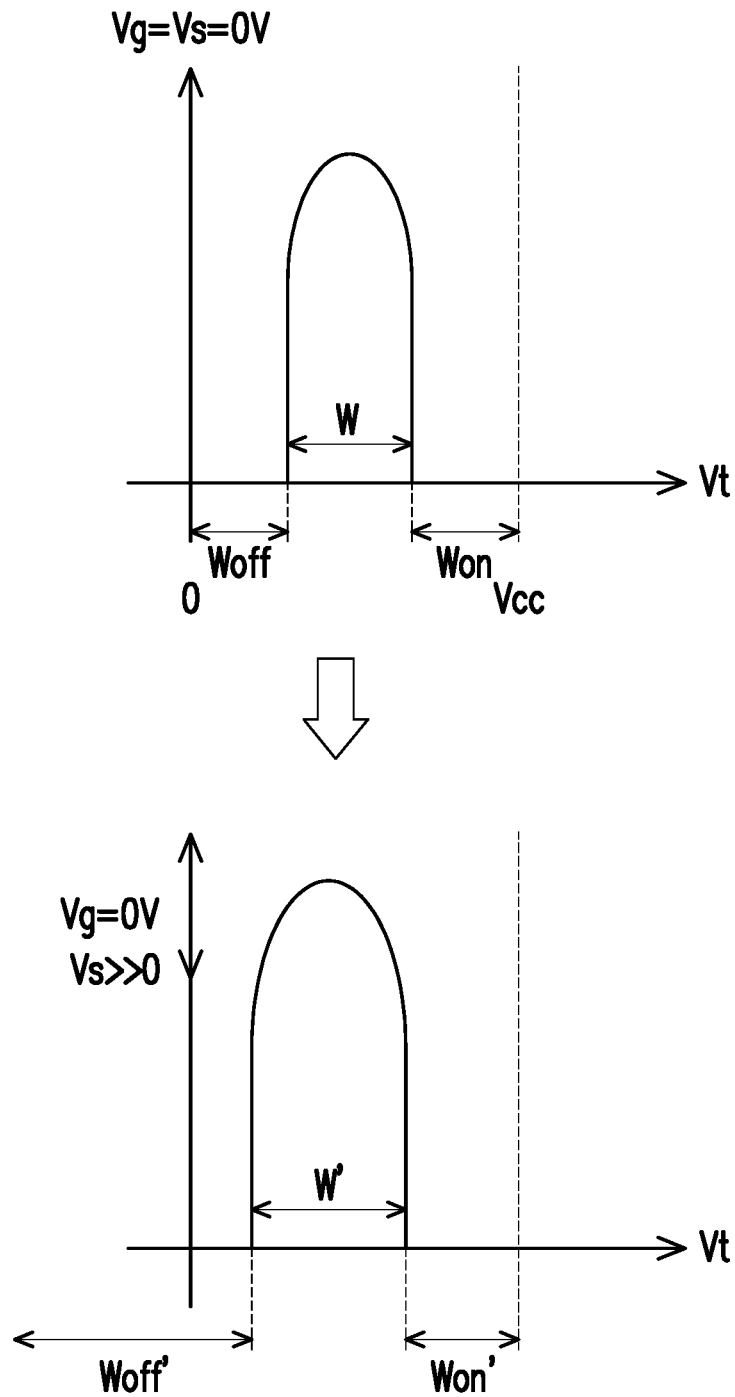
FIG. 10 is a diagram showing the difference in the improvement of the threshold voltage margin deterioration when the memory device performs data read and write operations according to an embodiment of the disclosure.

FIG. 10 is a diagram showing the difference in the improvement of the threshold voltage margin deterioration when the memory device performs data read and write operations according to an embodiment of the disclosure. Referring to FIG. 10, in the embodiment, the memory device reduces the off current Ioff by the source bias method. In detail, in the case where the size of the memory device is increased, the range of the threshold voltage Vt changes from the width W to the width W'. Therefore, in the embodiment of the present disclosure, when the gate voltage Vg of the selection transistor in the memory cell is equal to 0 volt and the source voltage Vs is greater than 0 volt, since the Vgs is less than 0 volt, the threshold voltage Vt can be shifted to the left to enlarge over-drive, that is, to make the width Won and the width Woff to change to the width Won' and the width Woff', respectively, to reserve more margin for the higher on current Ion, and to significantly suppress the off current Ioff, thereby improving the situation in which the on current Ion of the selected memory cell is interfered by the accumulated off current Ioff of the unselected memory cells. In the meantime, the situation of threshold voltage margin deterioration resulted from increase of size can also be improved to enhance read and write accuracy of the memory device.

In summary, the memory device and the operating method thereof provided by the present disclosure selectively outputs a first voltage to the source terminals of all memory cells in the memory cell block when there is a memory cell in a selected state in the memory cell block, selectively outputs a second voltage of which the absolute value is greater than the first voltage to the source terminals of all memory cells in the memory cell block when there is no memory cell in the selected state in the memory cell block. In this way, the occurrence of the off current can be suppressed to improve interference caused by the off current, and at the same time, the deterioration of the threshold voltage margin can be solved, such that the read and write accuracy of the memory device can be enhanced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
a plurality of memory cell blocks, each of the memory cell blocks having at least two memory cells; and
a source voltage generator, the source voltage generator coupled to the plurality of memory cell blocks, configured to:
cause a source voltage of the memory cell block to be a first voltage according to that a memory cell in each of the memory cell blocks is in a selected state,
cause the source voltage of the memory cell block to be a second voltage according to that all memory cells in each of the memory cell blocks are in an unselected state,
wherein an absolute value of the first voltage is less than an absolute value of the second voltage,
wherein the source voltage generator comprises:
a logic operation circuit, performing a logical operation on the plurality of memory cell blocks to generate the source voltage,
wherein the logic operation circuit comprises:
a plurality of logic gates respectively coupled to the plurality of memory cell blocks, the plurality of logic gates respectively receiving selection signals of the at least two memory cells in the plurality of memory cell blocks and outputting a plurality of control signals separately; and
a plurality of multiplexers respectively coupled to the plurality of logic gates, wherein the plurality of multiplexers selectively output the first voltage or the second voltage to source terminals of the at least two memory cells in the plurality of memory cell blocks according to the plurality of control signals respectively.

2. The memory device of claim 1, wherein the logical operation is an NOR logical operation.

3. The memory device of claim 1, wherein the at least two memory cells each comprise:
a selection transistor having a first terminal, a second terminal and a first gate terminal, the first terminal receiving the source voltage, the first gate terminal receiving a selection signal; and
a floating gate transistor having a third terminal, a fourth terminal and a second gate terminal, wherein the third terminal is coupled to the second terminal, the fourth terminal is coupled to a bit line, and the second gate terminal receives a control signal.

4. The memory device of claim 3, wherein each of the memory cell blocks has a first memory cell and a second memory cell,
wherein the first terminal of the selection transistor in the first memory cell is coupled to the first terminal of the selection transistor in the second memory cell to collectively receive the source voltage,
wherein the fourth terminal of the floating gate transistor in the first memory cell and the fourth terminal of the floating gate transistor in the second memory cell are coupled to the bit line.

5. The memory device of claim 1, wherein the memory device is a non-volatile memory.

6. The memory device of claim 5, wherein the non-volatile memory is a two-dimensional flash memory or a three-dimensional flash memory.

7. An operating method of a memory device, comprising:
providing a source voltage generator to cause, according to that a memory cell in each of a plurality of memory cell blocks is in a selected state, a source voltage of the memory cell block to be a first voltage; and
causing, according to that all memory cells in each of the plurality of memory cell blocks are in an unselected state, the source voltage of the memory cell block to be a second voltage,
wherein an absolute value of the first voltage is less than an absolute value of the second voltage,
wherein each of the plurality of memory cell blocks has at least two memory cells, and the step of providing the source voltage generator further comprises:

providing a logic operation circuit to perform a logical operation on the plurality of memory cell blocks to generate the source voltage,
wherein the step of providing the logic operation circuit further comprises:
providing a plurality of logic gates to respectively receive gate voltages of the at least two memory cells in the plurality of memory cell blocks, and outputting a plurality of control signals respectively; and
providing a plurality of multiplexers to selectively output the first voltage or the second voltage to source terminals of the at least two memory cells in the plurality of memory cell blocks according to the plurality of control signals respectively.

* * * * *